(12) United States Patent
Liu et al.

(10) Patent No.: US 11,722,245 B2
(45) Date of Patent: Aug. 8, 2023

(54) DATA ENCODING AND DECODING METHOD FOR UNDERWATER ACOUSTIC NETWORKS (UANS) BASED ON IMPROVED ONLINE FOUNTAIN CODE

(71) Applicant: Qinghai Normal University, Xining (CN)

(72) Inventors: Xiuxiu Liu, Xining (CN); Xiujuan Du, Xining (CN); Long Jin, Xining (CN)

(73) Assignee: Qinghai Normal University, Xining (CN)

( * ) Notice: Subject to any disclaimer, the term of this patent is extended or adjusted under 35 U.S.C. 154(b) by 0 days.

(21) Appl. No.: 17/971,408

(22) Filed: Oct. 21, 2022

(65) Prior Publication Data
US 2023/0055353 A1 Feb. 23, 2023

(30) Foreign Application Priority Data
Apr. 26, 2022 (CN) .......................... 202210449460.7

(51) Int. Cl.
*H04L 1/00* (2006.01)
*H04B 13/02* (2006.01)

(52) U.S. Cl.
CPC ............ *H04L 1/005* (2013.01); *H04B 13/02* (2013.01); *H04L 1/0061* (2013.01)

(58) Field of Classification Search
CPC ..... H04L 1/005; H04L 1/0047; H04L 1/0059; H04L 1/0057; H04L 1/0056;
(Continued)

(56) References Cited

U.S. PATENT DOCUMENTS 9,749,122 B2    8/2017   Doberstein

FOREIGN PATENT DOCUMENTS

CN    104539387 A    4/2015
CN    106788886 A    5/2017
(Continued)

OTHER PUBLICATIONS

Xiuxiu Liu et al., "ROFC-LF: Recursive Online Fountain Code With Limited Feedback for Underwater Acoustic Networks", IEEE Transactions on Communications, 2022, vol. 70, No. 7, pp. 4327-4342.
(Continued)

*Primary Examiner* — Phong La

(57) ABSTRACT

A data encoding and decoding method for underwater acoustic networks (UANs) based on an improved online fountain code, including: in a build-up phase, subjecting all original packets to sequential encoding according to their serial numbers to generate and send encoded packets with degree 2; merging k original packets to k/8 connected components with a size of 8; performing random encoding until a largest connected component is successfully decoded; in a completion phase, sending, by a receiver, a feedback packet according to a current decoding graph; according to a feedback packet containing decoding states of all the original packets, sending, by a sender, encoded packets with degree m; and randomly selecting original packets for recursive encoding to generate and send encoded packets with degree 1 or 2; and setting, by the receiver, a threshold to restrict the number of feedback packets.

6 Claims, 3 Drawing Sheets

---

SROFC-LF encoding mechanism

Build-up phase

Subjecting all original packets according to their serial numbers to sequential encoding to generate and send encoded packets with degree 2; merging *k* original packets to *k*/8 connected components with a size of 8

↓

Performing random encoding; randomly selecting two original packets from all the original packets for encoding to generate and send the encoded packets with degree 2, until a largest connected component in a decoding graph reaches *k*β; randomly selecting an original packet from all the original packets for encoding to generate and send an encoded packet with degree 1, until the largest connected component is successfully decoded

Completion phase

Sending a plurality of feedback packets, by a receiver, according to a current decoding graph; according to a feedback packet containing decoding states of all the original packets, sending, by a sender, a plurality of encoded packets with degree *m*; and randomly selecting original packets for recursive encoding to generate and send an encoded packet with degree 1 and an encoded packet with degree 2, so as to improve the probability of useful encoded packets; at the same time, setting, by the receiver, a threshold to restrict the feedback to effectively restrict the number of feedback packets

(58) Field of Classification Search
CPC ..... H04L 1/0064; H04L 1/0061; H04L 1/007; H04L 1/0042; H04B 13/02
See application file for complete search history.

(56) References Cited

FOREIGN PATENT DOCUMENTS

| | | | | |
|---|---|---|---|---|
| CN | 108259138 | A | 7/2018 | |
| CN | 109274462 | A | 1/2019 | |
| CN | 110535562 | A * | 12/2019 | |
| CN | 111064544 | A * | 4/2020 | |
| CN | 110535562 | B | 8/2020 | |
| CN | 110191248 | B * | 9/2020 | |
| CN | 112994847 | A * | 6/2021 | ........... H04L 1/0056 |
| CN | 112994847 | A | 6/2021 | |
| CN | 113873574 | A | 12/2021 | |
| CN | 111556222 | B * | 1/2022 | ........... H04L 1/0002 |
| CN | 113890683 | A * | 1/2022 | |
| WO | 2022041187 | A1 | 3/2022 | |

OTHER PUBLICATIONS

Gonghua Xu et al., "Data Redundancy Scheme for High Availability Based on Improved Fountain Code", Computer Engineering, 2010, vol. 36, No. 16, pp. 11-15.

* cited by examiner

DATA ENCODING AND DECODING METHOD FOR UNDERWATER ACOUSTIC NETWORKS (UANS) BASED ON IMPROVED ONLINE FOUNTAIN CODE

CROSS-REFERENCE TO RELATED APPLICATIONS

This application claims the benefit of priority from Chinese Patent Application No. 202210449460.7, filed on Apr. 26, 2022. The content of the aforementioned application, including any intervening amendments thereto, is incorporated herein by reference in its entirety.

TECHNICAL FIELD

This application relates to underwater acoustic network technology, and more particularly to a data encoding and decoding method for underwater acoustic networks (UANs) based on an improved online fountain code.

BACKGROUND

Ocean covers about 71% of the earth's surface, and is rich in material resources, and thus the rational development of marine resources and the protection of the marine environment are vital for human survival and development. Recently, underwater acoustic networks (UANs) have received widespread attention due to their potential applications in environmental monitoring, resource investigation, disaster prevention, marine engineering, and ocean observation. UANs adopt acoustic communication, which is characterized by high bit error on the order of $10^{-7}$-$10^{-3}$, long propagation delay (up to 0.76 s/km) and narrow bandwidth of kbps. Moreover, acoustic modems operate in half-duplex mode, and the sending-receiving transition of nodes will prolong the propagation delay. Additionally, the underwater acoustic channel suffers large noise interference, including ship noise, wave noise and biological noise. In addition, the sensor nodes are generally powered by batteries, which are difficult to recharge and replace in harsh underwater environment. These factors bring great challenges for the reliable data transmission of the UANs.

The underwater acoustic channel is an erasure channel, and many scholars have recently investigated reliable transmission based on digital fountain codes (DFCs) for UANs. Compared with the conventional DFCs, online fountain codes (OFCs) have lower overhead and better online feedback performance. Hence, the OFCs-based reliable transmission has attracted attention from scholars worldwide. After analyzing the encoding and decoding process and feedback problems of the online fountain codes, it was found that some useless coding packets and many feedback packets have been transmitted. In view of the low bandwidth, long propagation delay, high bit error, limited energy, and half-duplex communication of the UANs, the transmission of the useless coding packets will prolong the propagation delay, and consume extra energy, and channel bandwidth. Excessive feedback will aggravate the packet collision and propagation delay. In conclusion, the transmission of useless coding packets and excessive feedback packets will reduce the channel utilization, increase the energy consumption, and shorten the lifetime of UANs.

SUMMARY

An objective of this application is to provide a data encoding and decoding method for underwater acoustic networks (UANs) based on an improved online fountain code, so as to enable reliable data transmission of the UANs.

Technical solutions of this application are described as follows.

This application provides a data encoding and decoding method for underwater acoustic networks (UANs) based on an improved online fountain code, wherein the improved online fountain code is a sequential recursive online fountain code with limited feedback (SROFC-LF); data encoding and decoding are performed via a SROFC-LF encoding mechanism; and the method comprises:

in a build-up phase, based on the SROFC-LF encoding mechanism, subjecting all original packets to sequential encoding according to serial numbers of all the original packets to generate and send encoded packets with degree 2; merging k original packets to form k/8 connected components with a size of 8; performing random encoding by randomly selecting two original packets from all the original packets for encoding to generate and send an encoded packet with degree 2, until a size of a largest connected component in a decoding graph reaches $k\beta_0$; randomly selecting an original packet from all the original packets for encoding to generate and send an encoded packet with degree 1, until the largest connected component is successfully decoded; and in a completion phase, sending, by a receiver, a plurality of feedback packets according to a current state of the decoding graph; according to a feedback packet containing decoding states of all the original packets, sending, by a sender, coding packets with degree m, and then randomly selecting original packets for recursive encoding to generate and send an encoded packet with degree 1 and an encoded packets with degree 2, so as to make each coding packet useful for decoding; and at the same time, setting, by the receiver, a threshold to restrict the number of feedback packets.

In an embodiment, the SROFC-LF encoding mechanism comprises an encoding process and a decoding process; the encoding process comprises an encoding build-up phase and an encoding completion phase, and the decoding process comprises a decoding build-up phase and a decoding completion phase; and the decoding graph of the SROFC-LF encoding mechanism is represented by Uni-partite Graph.

In an embodiment, supposing that the sender has a block containing k original packets, and the receiver maintains a decoding graph G(V,E), V=k, E=Ø with k white nodes and no edges; the encoding process comprises:

in the encoding build-up phase, performing, by the sender, sequential encoding on all the original packets according to the serial numbers to generate and send the encoded packets with degree 2; performing the random encoding, by randomly selecting two original packets from all the original packets for encoding to continuously generate and send an encoded packet with degree 2, until the size of the largest connected component in the decoding graph reaches $k\beta_0$; randomly selecting an original packet from all the original packets for encoding to generate and send an encoded packet with degree 1, until the largest connected component in the decoding graph is successfully decoded; and in the encoding completion phase, according to state field of the feedback packets, classifying, by the sender, all the original packets into a set $W_i(k-|A_i|,SNsw)$ containing unrecovered original packets and a set $A_i(|A_i|,SNsa)$ containing recovered original packets; according to a set $W_1(k-|A_1|,SNsw)$ which is divided according to feedback packets about successful decoding of the largest connected component, generating and sending encoded packets with degree m; according to a probability of an encoded packet with degree 1 and a probability of an encoded packet with degree 2, randomly selecting original packets from the set $W_i(k-|A_i|,\text{SNsw})$ to generate and send an encoded packet with degree 1 and an encoded packet with degree 2; if the feedback packet containing the decoding states of all the original packets is received, updating the set $W_i(k-|A_i|,\text{SNsw})$ and performing the recursive encoding to generate and send an encoded packet with degree 1 and an encoded packet with degree 2; and repeating such process, until all the original packets are decoded successfully.

In an embodiment, the sequential encoding comprises:

(S1) arranging all the original packets according to the serial numbers; from a first original packet in all the original packets, selecting two consecutive original packets for XOR encoding to generate an encoded packet with degree 2; marking one of the two consecutive original packets as $D_i$ with a serial number of i, and the other as $D_{(i+1)}$ with a serial number of i+1; marking the encoded packet as $C_j$ with a serial number of j; and $C_j=D_i \oplus D_{(i+1)}$; when k is an odd number, i=1, 3, 5, 7, 9 ... k−2, and $C_{(k+1)/2}=D_k \oplus D_1$; when k is an even number, i=1, 3, 5, 7, 9 ... k−1; sending, by the sender, the encoded packet $C_j$ to the receiver, until sequential encoding is completed;

(S2) with respect to all original packets with an odd serial number, subjecting two consecutive original packets according to a sequence of serial numbers to encoding to generate encoded packets with degree 2, expressed as $C_j=D_i \oplus D_{(i+2)}$, wherein i=1, 5, 9, 13, 17 ... ([k/4]−1)*4+1; and sending, by the sender, the encoded packet $C_j$ to the receiver until the sequential encoding is completed; and (S3) with respect to original packets whose serial number is an odd number having a remainder of 1 when divided by 4, subjecting two consecutive original packets according to a sequence of serial numbers to encoding to generate an encoded packet with degree 2, expressed as $C_j=D_i \oplus D_{(i+4)}$, wherein i=1, 9, 17, 25, 33 ... ([k/8]−1)*8+1; and sending, by the sender, the encoded packet $C_j$ to the receiver until sequential encoding is completed.

In an embodiment, the random encoding comprises:

randomly selecting, by the sender, two original packets from all the original packets for encoding to generate and send an encoded packet with degree 2, and repeating such process, until a feedback packet containing information that "a size of the largest connected component in the decoding graph reaches $k\beta_0$, and an encoded packet with degree 1 is required" is received; according to the feedback packet, adjusting encoding strategy; randomly selecting an original packet from all the original packets to generate and send an encoded packet with degree 1, and repeating such process, until a feedback packet containing information that "the largest connected component is decoded successfully, and the decoding states of all the original packets" is received.

In an embodiment, the decoding process comprises:

in the decoding build-up phase, receiving, by the receiver, the encoded packet with degree 2 and updating the decoding graph G; when the largest connected component in the decoding graph reaches $k\beta_0$, sending a feedback packet containing information that "the largest connected component in the decoding graph reaches $k\beta_0$, and an encoded packet with degree 1 is required"; receiving the encoded packet with degree 1 until the largest connected component is successfully decoded, and sending a feedback containing information that "the largest connected component is decoded successfully, and the decoding states of all the original packets"; in the decoding completion phase, receiving the encoded packet with degree m, and updating the decoding graph G; continuously receiving the encoded packet with degree 1 and the encoded packet with degree 2; when the receiver finds that a proportion f(j) of original packets successfully decoded in a j-th decoding and a proportion f(j−1) of original packets successfully decoded in a (j−1)-th decoding satisfies $f(j)-f(j-1) > \delta(j \geq 1)$ sending a feedback packet containing the decoding states of all the original packets to the sender; continuously receiving the encoded packet with degree 1 and the encoded packet with degree 2, and repeating such process, until all the original packets are successfully decoded; and sending a feedback packet containing information that "all the original packets are successfully decoded".

Compared with the prior art, this application has the following beneficial effects.

1) The build-up phase is improved. Specifically, the number of connected components is minimized, and accordingly in the completion phase, the number of required encoded packets and feedback packets is reduced, shortening the end-to-end delay, decreasing the energy consumption, and improving the utilization of the bandwidth resources.

2) The completion phase is improved, so as to make each of the encoded packets helpful for decoding, and avoiding the transmission of useless encoded packets, effectively enhancing the channel utilization, and lowering the energy consumption.

3) The number of feedback packets is reduced. The underwater acoustic channel adopts half-duplex communication, and a large amount of feedback will cause channel collisions and prolong the propagation delay.

DETAILED DESCRIPTION OF EMBODIMENTS

In order to make the technical solutions of the disclosure clearer, this application will be described in detail below with reference to the accompanying drawings and embodiments. It should be understood that the following embodiments are merely illustrative of this application, and are not intended to limit this application.

Embodiment 1

Figure 1:
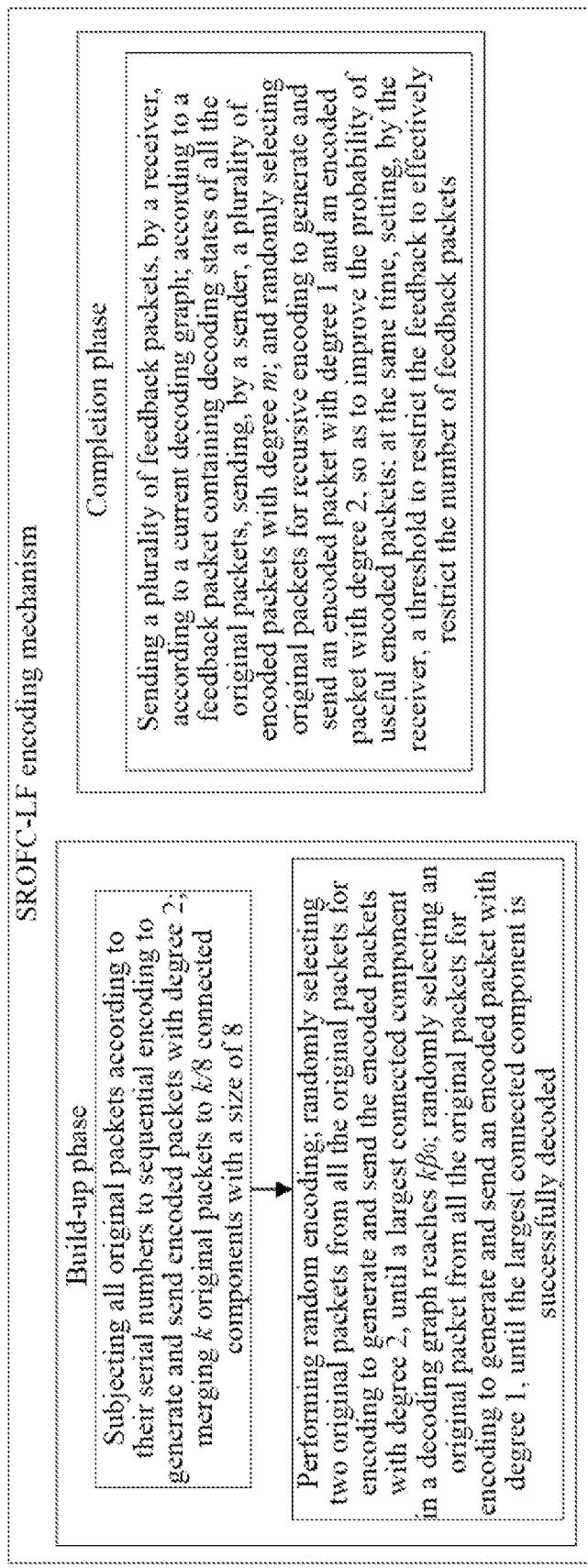
FIG. 1 schematically illustrates an encoding mechanism of a sequential recursive online fountain code with limited feedback (SROFC-LF) according to Embodiment 1 of this application.

Referring to an embodiment shown in FIG. 1, a data encoding and decoding method for underwater acoustic networks (UANs) based on an improved online fountain code is provided, where the improved online fountain code is a sequential recursive online fountain code with limited feedback (SROFC-LF), and the data encoding and decoding of the UANs are performed via a SROFC-LF encoding mechanism.

In a build-up phase, based on the SROFC-LF encoding mechanism, all original packets are subjected to sequential encoding according to serial numbers of the original packets to generate and send encoded packets with degree 2. k original packets are merged to form k/8 connected components with a size of 8. Random encoding is performed by randomly selecting two original packets from all the original packets for encoding to generate and send an encoded packet with degree 2, until a size of a largest connected component in a decoding graph reaches $k\beta_0$. An original packet is selected from all the original packets for encoding to generate and send an encoded packet with degree 1, until the largest connected component is successfully decoded. In a completion phase, a receiver sends a plurality of feedback packets according to a current state of the decoding graph. According to a feedback packet containing decoding states of all the original packets, a sender sends coding packets with degree m, and then original packets for recursive encoding are randomly selected to generate and send an encoded packet with degree 1 and an encoded packet with degree 2, so as to make each coding packet useful for decoding. At the same time, the receiver sets a threshold to restrict the number of feedback packets.

The SROFC-LF encoding mechanism includes an encoding process and a decoding process. The encoding process includes an encoding build-up phase and an encoding completion phase, and the decoding process includes a decoding build-up phase and a decoding completion phase. The decoding graph of the SROFC-LF encoding mechanism is represented by Uni-partite Graph.

Supposing that the sender has a block containing k original packets, the receiver maintains a decoding graph G(V,E) V=k, E=∅ with k white nodes and no edges, and the encoding process is performed as follows.

In the encoding build-up phase, the sender performs sequential encoding on all the original packets according to the serial numbers to generate and send the encoded packets with degree 2. The random encoding is performed by randomly selecting two original packets from all the original packets for encoding to continuously generate and send an encoded packet with degree 2, until the size of the largest connected component in the decoding graph reaches $k\beta_0$. An original packet is randomly selected from all the original packets for encoding to generate and send an encoded packet with degree 1, until the largest connected component is successfully decoded.

In the encoding completion phase, according to state field of the feedback packets, the sender classifies all the original packets into a set $W_i(k-|A_i|,SNsw)$ containing unrecovered original packets and a set $A_i(|A_i|,SNsa)$ containing recovered original packets. According to a set $W_1(k-|A_1|,SNsw)$ which is divided according to the feedback packets about the successful decoding of the largest connected component, encoded packets with degree m are generated and sent. According to a probability of an encoded packet with degree 1 and a probability of an encoded packet with degree 2, original packets are randomly selected from the set $W_i(k-|A_i|,SNsw)$ to generate and send an encoded packet with degree 1 and an encoded packet with degree 2. If the feedback packet containing the decoding states of all the original packets is received, the set $W_i(k-|A_i|,SNsw)$ is updated, and recursive encoding is performed to generate and send an encoded packet with degree 1 and an encoded packet with degree 2. Such process is repeated, until all the original packets are decoded successfully.

The encoded packet with degree 1, an encoded packet with degree 2 and the encoded packets with degree m that are sent in the encoding completion phase are all useful for decoding. The probability sum of an encoded packet with degree 1, an encoded packet with degree 2 and the encoded packets with degree m that are sent in the encoding completion phase is 1, where the probability of the encoded packets with degree m is calculated as: $p_m=N_m/k$, the probability of the encoded packet with degree 1 is $p_1$, and the probability of the encoded packet with degree 2 is calculated as $p_2=1-p_1-p_m$.

The sequential encoding includes three steps, which are performed as follows.

(S1) All the original packets are arranged according to the serial numbers. From a first original packet in all the original packets, two consecutive original packets are selected for XOR encoding to generate an encoded packet with degree 2. One of the two consecutive original packets are marked as $D_i$ with a serial number of i, and the other as $D_{(i+1)}$ with a serial number of i+1. The encoded packet is marked as $C_j$ with a serial number of j, where $C_j=D_i \oplus D_{(i+1)}$; when k is an odd number, i=1, 3, 5, 7, 9 ... k−2, and $C_{(k+1)/2}=D_k \oplus D_1$; when k is an even number, i=1, 3, 5, 7, 9 ... k−1. the sender sends the encoded packet $C_j$ to the receiver until sequential encoding is completed.

(S2) With respect to all original packets with an odd serial number, two consecutive original packets according to a sequence of serial numbers are subjected to encoding to generate an encoded packet with degree 2, expressed as $C_j=D_i \oplus D_{(i+2)}$, where i=1, 5, 9, 13, 17 ... ([k/4]−1)*4+1. The sender sends the encoded packet $C_j$ to the receiver until sequential encoding is completed.

(S3) With respect to original packets whose serial number is an odd number having a remainder of 1 when divided by 4, two consecutive original packets according to a sequence of serial numbers are subjected to encoding to generate an encoded packet with degree 2, expressed as $C_j=D_i \oplus D_{(i+4)}$, where i=1, 9, 17, 25, 33 ... ([k/8]−1)*8+1. The sender sends the encoded packet $C_j$ to the receiver until sequential encoding is completed.

The random encoding is performed as follows.

The sender randomly selects two original packets from all the original packets for encoding to generate and send an encoded packet with degree 2, and such process is repeated until a feedback packet containing information that "a size of the largest connected component in the decoding graph reaches $k\beta_0$, and an encoded packet with degree 1 is required" is received. According to the feedback packet, encoding strategy is adjusted. An original packet is randomly selected from all the original packets to generate and send an encoded packet with degree 1, and such process is repeated, until a feedback packet containing information that "the largest connected component is decoded successfully, and the decoding states of all the original packets" is received.

The decoding process is performed as follows.

In the decoding build-up phase, the receiver receives the encoded packet with degree 2 and updates the decoding graph G. When the largest connected component in the decoding graph reaches $k\beta_0$, a feedback packet containing information that "the largest connected component in the decoding graph reaches $k\beta_0$, and an encoded packet with degree 1 is required" is sent. The encoded packet with degree 1 is received until the largest connected component is successfully decoded, and a feedback packet containing information that "the largest connected component is decoded successfully, and the decoding states of all the original packets" is sent.

In the decoding completion phase, the encoded packet with degree m are received, and the decoding graph G is updated. The encoded packet with degree 1 and the encoded packet with degree 2 are continuously received. When the receiver finds that a proportion f(j) of original packets successfully decoded in a j-th decoding and a proportion f(j−1) of original packets successfully decoded in a (j−1)-th decoding satisfies f(j)−f(j−1)>δ(j≥1), a feedback packet containing the decoding states of all the original packets is sent to the sender. The encoded packet with degree 1 and the encoded packet with degree 2 are continuously received, and such process is repeated, until all the original packets are successfully decoded. A feedback packet containing information that "all the original packets are successfully decoded" is sent.

Online Fountain Code (OFC)

The OFC is a fountain code capable of encoding and decoding online. The principle of the OFC is that the sender is configured to obtain an optimal strategy for the next encoding according to any decoding states fed back by the receiver, and the receiver is configured to control and monitor the encoding and decoding process in real time. The OFC is a new type of rateless code, which is equivalent to a fountain code with real-time capability. The decoding overhead of OFC is lower than the overhead of the traditional fountain codes. The OFC is configured to calculate the optimal encoding strategy according to the instantaneous decoding state fed back by the receiver. The OFC is a rateless code based on Uni-partite Graph. The encoding and decoding process includes a build-up phase and a completion phase.

In the build-up phase, the sender randomly selects 2 original packets from all the original packets for exclusive or (XOR) operation to generate an encoded packet with degree 2, such process is repeated until a feedback packet containing information that "a size of the largest connected component in the decoding graph reaches $k\beta_0$, and an encoded packet with degree 1 is required" is received, where $\beta_0$< is a decimal that satisfies $0<\beta_0<1$, and also a given parameter. Then, the sender randomly selects an original packet from k original packets for encoding to generate an encoded packet with degree 1, such process is repeated, until a feedback packet containing information that "the largest connected component is decoded successfully".

In the completion phase, the receiver calculates a ratio β of the number of recovered original packets to k, which is the number of the original packets. According to the ratio β and an equation (1), an optimal degree $m_{opt}$ is calculated and fed back to the sender. The sender performs encoding according to the optimal degree $m_{opt}$ until all the original packets are decoded successfully. The receiver receives encoded packets with degree $m_{opt}$. Only the encoded packets falling into Case 1 and Case 2 will be processed for updating the decoding graph, other encoded packets that do not fall into Case 1 and Case 2 will be discarded. Case 1 and Case 2 are described as follows.

Case 1: The encoded packet is generated by subjecting a white node and m−1 black nodes to XOR operation.

Case 2: The encoded packet is generated by subjecting two white nodes and m−2 black nodes to XOR operation.

The equation (1) is expressed as follows:

$$m_{opt} = \text{argmax}_m[P_1(m,\beta) + P_2(m,\beta)] \quad (1).$$

Figure 2:
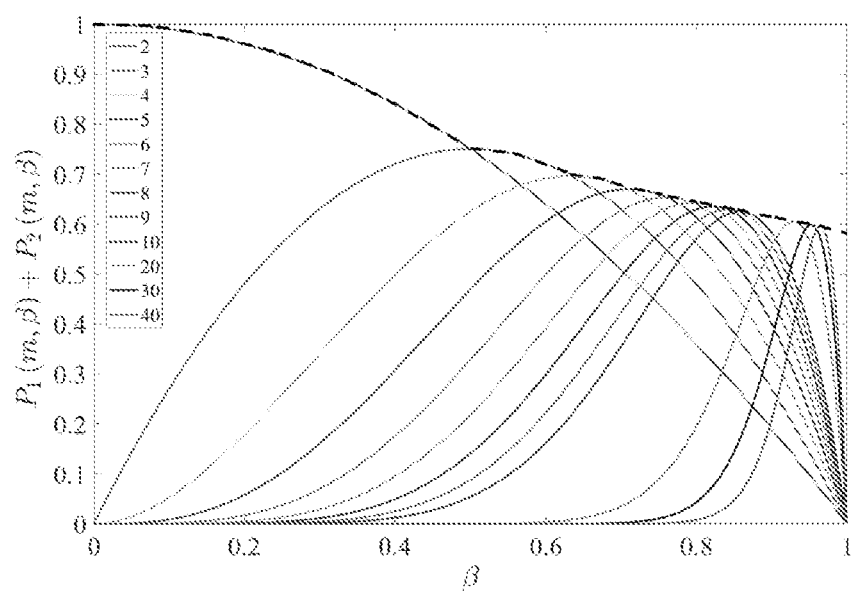
FIG. 2 schematically shows a probability sum of Case 1 and Case 2, and a maximum value of the probability sum of Case 1 and Case 2 in a completion phase of the online fountain code (OFC) according to Embodiment 1 of this application.

The equation (1) indicates that when β is fixed, the degree m that maximizes the probability sum of Case 1 and Case 2 is the optimal degree $m_{opt}$. In the equation (1), $P_1(m,\beta)$ indicates the probability of Case 1, and $P_2(m,\beta)$ indicates the probability of Case 2. The probability of Case 1 and the probability of Case 2 are calculated as follows:

$$P_1(m, \beta) = \binom{m}{1}\beta^{m-1}(1-\beta); \quad (2)$$

$$P_2(m, \beta) = \binom{m}{2}\beta^{m-2}(1-\beta)^2; \quad (3)$$

when m=2 m=3 m=4 m=5 m=6 m=7 m=8 m=9, m=10, m=20, m=30 and m=40, a relationship between $P_1(m,\beta)+P_2(m,\beta)$ and β is shown in FIG. 2. As illustrated in FIG. 2, when β is within a certain range, the optimal degree $m_{opt}$ exists. As β increases, a value range of β that is corresponding to the optimal degree $m_{opt}$ is becoming smaller, which indirectly reflects that the feedback becomes more frequent. The black dashed line is an asymptote of the maximum value of the probability sum of Case 1 and Case 2. As β increases, $P_1(m_{opt},\beta)+P_2(m_{opt},\beta)$ gradually decreases.

Performance Analysis of Online Fountain Code in Underwater Acoustic Networks (UANs)

As shown in FIG. 2, as β increases, the probability of the received encoded packets falling into Case 1 and Case 2 decreases, and the probability of useless coding packets increases. It can be seen that in the completion phase, although OFC is looking for the optimal strategy for encoding, but the receiver still discards a large number of encoded packets that have been successfully received. Due to the characteristics of narrow bandwidth, long propagation delay and limited energy of the UANs, the useless coding packets are transmitted, which will waste the channel bandwidth, prolong the propagation delay, consume extra energy of the sensor nodes, reduce the communication performance and network lifetime of UANs. Therefore, it is hoped that each coding packet transmitted in the UANs can be useful for decoding, such that the utilization efficiency of the network resources can be improved.

The OFC achieves online performance through feedback. The receiver is configured to control and monitor the encoding and decoding process. Most of the feedback packets are sent in the completion phase, and thus the more coding packets required in the completion phase, the more feedback packets are generated. UANs adopt half-duplex communication, in which receiving and sending are not allowed to be performed at the same time. When a feedback packet needs to be sent, both the receiver and the sender are required to perform the transition between receiving and sending. The transition between receiving and sending of the underwater acoustic modem prolongs the propagation delay. A large number of feedback packets will lead to packet collision, which will further prolong the delay and increase the energy consumption. The UANs are generally powered by batteries, and the energy is limited, such that too much feedback will shorten the network lifetime of UANs. Thus, OFC suitable for UANs should have less feedback.

In the completion phase, in OFC, only the encoded packets falling into Case 1 or Case 2 will be processed by the receiver. Case 1 is capable of decoding at least one original packet, and reducing one connected component simultaneously. Case 2 is capable of adding an edge to the decoding graph, and reducing one connected component simultaneously. It can be seen that both the encoded packets of Case 1 type and the encoded packets of Case 2 type will cause the reduction of the number of the connected components in the decoding graph G. According to the OFC performance, it can be known that the reduction of the number of the connected components will promote the development of decoding. Thus, it is also desirable to minimize the number of connected components in the decoding graph in the build-up phase.

The reduction of the number of the connected components in the build-up phase will reduce the number of coding packets and feedback packets required by the completion phase. In conclusion, the OFC cannot be directly applied to UANs. In this embodiment, the OFC is improved according to the characteristics of the UANs, and the OFC suitable for the UANs is designed.

Sequential Recursive Online Fountain Code with Limited Feedback (SROFC-LF)

The decoding state is set. In the build-up phase of an improved online fountain code, according to serial number arrangement rules, all the original packets are subjected to sequential encoding. In the completion phase, according to the information of the feedback packets, the recursive coding is performed. The improved online fountain code is named as a sequential recursive online fountain code (SROFC). According to the decoding states of all original packets contained in the feedback packet, the SROFC find out the optimal coding strategy. Therefore, the decoding state of the SROFC is expressed in the following equation (4):

$$F'(A) = \underbrace{\{0, 0, 0, 0 \ldots, 1, 0, 0 \ldots, 0, 1, 0\}}_{\text{the number of 1 is }|A|}; \quad kbits \qquad (4)$$

where there are k bits in total; each of the k bits indicates an original packet; the k bits are arranged in ascending order of the serial numbers of the original packets; 0 indicates that the original packets are not successfully decoded (that is, represented by white nodes in the decoding graph); 1 indicates that the original packets are successfully decoded (that is, represented by black nodes in the decoding graph). For example, there are 8 original packets, whose serial numbers (SNs) are respectively expressed as: SNs={1,2,3,4,5,6,7,8}. The original packets that have been already decoded by the receiver is $A_i(|A_i|,SNsa)=\{3,6,8\}$, and the decoding state is expressed as:

$$F'(A) = \underbrace{\{0, 0, 1, 0, 0, 1, 0, 1\}}_{\text{the number of 1 is 3}}; \quad 8bits \qquad (5)$$

The feedback is set. In the completion phase of the SROFC, only the encoded packet with degree 1, the encoded packet with degree 2 and the encoded packets with degree m are sent. The degree m is not calculated according to the equation (1) for optimal degree calculation of OFC. If the ratio β of the number of the successfully decoded original packets changes, the receiver sends the feedback packets, such that the number of the feedback packets are relatively large. Since all the original packets are subjected to sequential encoding according to serial numbers of the original packets in the build-up phase, the SROFC merges k original packets to form k/8 connected components with a size of 8. In the random encoding process of the build-up phase, the encoded packets with degree 2 are continuously sent, which may lead to that the connected components with a size of 8 are merged continuously, such that the receiver receives an encoded packet with degree 1 and decode at least 8 original packets. In conclusion, a feedback threshold of the completion phase is set as δ>8/k.

When the largest connected component is successfully decoded, a proportion of the original packets successfully decoded at the first time is calculated as $f(0)=N_0/k$ where $N_0$ indicates the total number of the original packets successfully decoded by the receiver, when the largest component is successfully decoded. In the completion phase, the encoded packets are continuously received and decoded. The proportion of the original packets successfully decoded at the first time in the completion phase is calculated as $f(1)=N_1/k$, where $N_1$ indicates the total number of the original packets successfully decoded by the receiver at the first time in the completion phase. Then, the recursive calculation is performed. The proportion of the original packets successfully decoded in a j-th time subtracts the proportion of the original packets successfully decoded in a (j−1)-th time to obtain a difference value. If the difference value is larger than δ, the receiver sends the feedback packets, that is $f(j)-f(j-1)>\delta(j\geq 1)$, where f(j) indicates a proportion of the original packets successfully decoded in the j-th time, and is calculated by $f(j)=N_j/k$; and f(j−1) indicates a proportion of the original packets successfully decoded in the (j−1)-th time, and is calculated by $f(j-1)=N_{(j-1)}/k$. The threshold δ is set according to 8/k, and presents one significant digit. The threshold δ is shown in Table 1. The SROFC limits the number of feedback packets by setting the feedback threshold, resulting in that the set $W_i(k-|A_i|,SNsw)$ containing unrecovered original packets is not updated in time, such that the encoded packet with degree 1 and the encoded packet with degree 2 may occur repeatedly. Thus, it can simply prove that the probability of repetition of the encoded packet with degree 1 and the encoded packet with degree 2 is small. However, in the UANs, sending the same number of feedback packets has a greater impact than sending the same number of encoded packets. Therefore, a sequential recursive online fountain code with limited feedback (SROFC-LF) suitable for UANs is proposed.

TABLE 1

| | Feedback threshold | | | | | | | | | | |
|---|---|---|---|---|---|---|---|---|---|---|---|
| k | 100 | 500 | 512 | 1000 | 1500 | 2000 | 2500 | 3000 | 3500 | 4000 | 4500 | 5000 |
| δ | 0.1 | 0.02 | 0.02 | 0.01 | 0.006 | 0.005 | 0.004 | 0.003 | 0.003 | 0.002 | 0.002 | 0.002 |

Performance Analysis of SROFC-LF in UANs

Due to the characteristics of low bandwidth, long propagation delay, high bit error rate, limited energy, half-duplex communication, and nodes moving with water flow, the reliable transmission of UANs is greatly challenged in use.

The SROFC-LF is proposed to ensure reliable data transmission in UANs. The underwater acoustic channel is equivalent to the erasure channel. If the received encoded packet cannot pass the detection and deletion module, the encoded packet is discarded. The performance of SROFC-LF is analyzed, so as to analyze the coding, decoding and feedback problems.

The analysis of coding and decoding is described as follows. Based on the SROFC-LF encoding mechanism, the number of the sent encoded packets is related to $\varepsilon$. When $\varepsilon$ is larger, the number of the required encoded packets is larger. When the number of original packets, that is k, is unchangeable, the number of the encoded packets sent during the sequential encoding process in the build-up phase of the SROFC-LF encoding mechanism remains unchanged, and is irrelevant with $\varepsilon$. Since $\varepsilon>0$, the coding loss occurs, which influences the formation of the connected component of size 8 in the build-up phase, such that more encoded packets are required to be sent in the completion phase. In the completion phase, the SROFC-LF encoding mechanism sends the encoded packets with degree m, which prevents some original packets from being decoded all the time. Therefore, when the channel erasure probability is high, the number of encoded packets required by the SROFC-LF encoding mechanism is theoretically advantageous, and is suitable for UANs with high bit error rate.

The feedback analysis is described as follows. When the number of all the original packets, which is k, and the proportion of the largest connected components, which is $\beta_0$, are determined, the number of original packets decoded in the build-up phase is relatively constant, and the number of original packets to be decoded in the completion phase is also determined. No matter if there is a channel erasure probability, the SROFC-LF encoding mechanism only sends feedback packets when the SROFC-LF encoding mechanism satisfies the requirement of $f(j)-f(j-1)>\delta(j\geq1)$, that is the number of the original packets that are successfully decoded in a j-th decoding and the number of the original packets that are successfully decoded in a (j-1)-th decoding satisfy the requirement of $N_j-N_{j-1}>\delta k$ the feedback packets are sent. Thus, the number of encoded packets sent has little effect on the actual number of feedback packets successfully sent. However, due to the channel erasure probability $\varepsilon$, the feedback packets can also be lost. Therefore, the channel erasure probability directly influences the number of feedback packets.

In this embodiment, the problems of coding and decoding, and feedback are analyzed. Based on the characteristics of UANs, the OFC is improved, and a SROFC-LF encoding mechanism is proposed. In this embodiment, the encoding process and the decoding process in the build-up phase and the completion phase of the OFC are respectively improved. In a build-up phase, based on the encoding mechanism of SROFC-LF, according to serial numbers of original packets, all the original packets are subjected to sequential encoding. k original packets are merged to form k/8 connected components with a size of 8, which is conducive to the reduction of the number of the encoded packets and the number of the feedback packets required in the completion phase. Then, random encoding is performed as in the build-up phase of the OFC encoding mechanism. In the completion phase, the feedback packet with the decoding states of all the original packets is fed back. According to state field of the feedback packets, the sender classifies all the original packets into a set $A_t(|A_t|,SNsa)$ containing recovered original packets and a set $W_t(k-|A_t|,SNsw)$ containing unrecovered original packets. Then, recursive encoding is performed. In the completion phase, the feedback threshold is set to restrict the number of feedback packets.

Figure 3A:
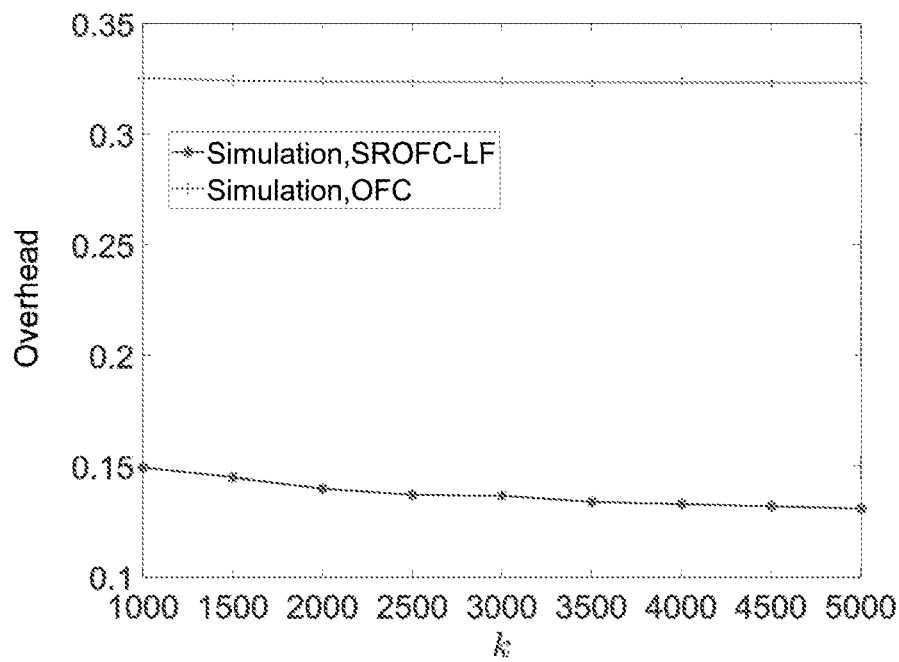
FIG. 3a schematically shows comparison between an overhead of SROFC-LF encoding and an overhead of the OFC according to Embodiment 1 of this application.
Figure 3B:
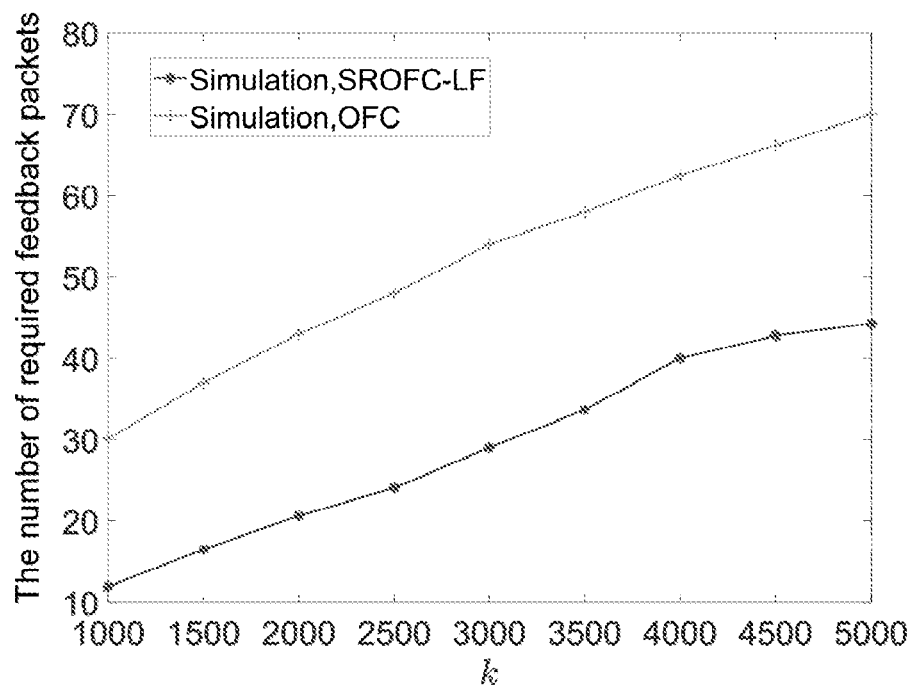
FIG. 3b is a schematic diagram showing comparison between the number of feedback packets in the SROFC-LF encoding and the number of feedback packets of the OFC according to Embodiment 1 of this application.

FIGS. 3a and 3b show the effect of different numerical values of k on the overhead (the ratio of the number of redundant encoded packets to k, and the number of redundant encoded packets is obtained by subtracting k from the number of the transmitted encoded packets) and the number of the required feedback packets. When $\varepsilon=0.1$ and $\beta_0=0.5$, the number of all the original packets, that is k, increases from 1000 to 5000, the feedback threshold of the SROFC-LF encoding mechanism is shown in Table 1. The overheads of the OFC and SROFC-LF encoding schemes decrease with the increase of k, and tend to be steady. When recovering the same number of original packets, the overhead of the OFC encoding mechanism is more than twice that of the SROFC-LF encoding mechanism. The number of required feedback packets increases with increasing of k. However, when recovering the same number of original packets, the number of feedback packets required by the OFC encoding mechanism is on average twice that of the SROFC-LF encoding mechanism. In conclusion, the SROFC-LF encoding scheme proposed in this embodiment has better performance in both overhead and number of feedback packets than the online fountain code (OFC) encoding scheme, and is suitable for the UANs with limited bandwidth and energy and high bit error rate.

The above embodiments are merely illustrative of this application, and are not intended to limit this application. It should be understood that modifications, variations and replacements made by those skilled in the art without departing from the spirit of the application should still fall within the scope of the present application defined by the appended claims.

What is claimed is:

1. A data encoding and decoding method for underwater acoustic networks (UANs) based on an improved online fountain code, wherein the improved online fountain code is a sequential recursive online fountain code with limited feedback (SROFC-LF); data encoding and decoding are performed via a SROFC-LF encoding mechanism; and the method comprises:
   in a build-up phase, based on the SROFC-LF encoding mechanism, subjecting all original packets to sequential encoding according to serial numbers of the original packets to generate and send encoded packets with degree 2; merging k original packets to form k/8 connected components with a size of 8; performing random encoding by randomly selecting two original packets from all the original packets for encoding to generate and send an encoded packet with degree 2, until a size of a largest connected component in a decoding graph reaches $k\beta_0$; randomly selecting an original packet from all the original packets for encoding to generate and send an encoded packet with degree 1, until the largest connected component is successfully decoded; and
   in a completion phase, sending, by a receiver, a plurality of feedback packets according to a current state of the decoding graph; according to a feedback packet containing decoding states of all the original packets, sending, by a sender, coding packets with degree m, and then randomly selecting original packets for recursive encoding to generate and send an encoded packet with degree 1 and an encoded packet with degree 2, so as to make each coding packet useful for decoding; and at the same time, setting, by the receiver, a threshold to restrict a number of feedback packets.

2. The data encoding and decoding method of claim 1, wherein the SROFC-LF encoding mechanism comprises an encoding process and a decoding process; the encoding process comprises an encoding build-up phase and an encoding completion phase, and the decoding process comprises a decoding build-up phase and a decoding completion phase; and the decoding graph of the SROFC-LF encoding mechanism is represented by Uni-partite Graph.

3. The data encoding and decoding method of claim 2, wherein supposing that the sender has a block containing k original packets, and the receiver maintains a decoding graph $G(V,E)$, $V=k$, $E=\emptyset$ with k white nodes and no edges, the encoding process comprises:

in the encoding build-up phase, performing, by the sender, sequential encoding on all the original packets according to the serial numbers to generate and send the encoded packets with degree 2; performing the random encoding by randomly selecting two original packets from all the original packets for encoding to continuously generate and send an encoded packet with degree 2, until the size of the largest connected component in the decoding graph reaches $k\beta_0$; randomly selecting an original packet from all the original packets for encoding to generate and send an encoded packet with degree 1, until the largest connected component is successfully decoded; and in the encoding completion phase, according to state field of the feedback packets, classifying, by the sender, all the original packets into a set $W_i(k-|A_i|,SNsw)$ containing unrecovered original packets and a set $A_i(|A_i|,SNsa)$ containing recovered original packets; according to a set $W_1(k-|A_1|,SNsw)$ which is divided according to feedback packets about successful decoding of the largest connected component, generating and sending encoded packets with degree m; according to a probability of an encoded packet with degree 1 and a probability of an encoded packet with degree 2, randomly selecting original packets from the set $W_i(k-|A_i|,SNsw)$ to generate and send an encoded packet with degree 1 and an encoded packet with degree 2; if the feedback packet containing the decoding states of all the original packets is received, updating the set $W_i(k-|A_i|,SNsw)$ and performing recursive encoding to generate and send an encoded packet with degree 1 and an encoded packet with degree 2; and repeating such process, until all the original packets are decoded successfully.

4. The data encoding and decoding method of claim 3, wherein the sequential encoding comprises:

(S1) arranging all the original packets according to the serial numbers; from a first original packet in all the original packets, selecting two consecutive original packets for XOR encoding to generate an encoded packet with degree 2; marking one of the two consecutive original packets as $D_i$ with a serial number of i, and the other as $D_{(i+1)}$ with a serial number of i+1; marking the encoded packet as $C_j$ with a serial number of j, wherein $C_j=D_i \oplus D_{(i+1)}$; when k is an odd number, i=1, 3, 5, 7, 9 ... k-2, and $C_{(k+1)/2}=D_k \oplus D_1$; when k is an even number, i=1, 3, 5, 7, 9 ... k-1; sending, by the sender, the encoded packet $C_j$ to the receiver until sequential encoding is completed;

(S2) with respect to all original packets with an odd serial number, subjecting two consecutive original packets according to a sequence of serial numbers to encoding to generate an encoded packet with degree 2, expressed as $C_j=D_i \oplus D_{(i+2)}$, wherein i=1, 5, 9, 13, 17 ... ([k/4]−1)*4+1; and sending, by the sender, the encoded packet $C_j$ to the receiver until sequential encoding is completed; and (S3) with respect to original packets whose serial number is an odd number having a remainder of 1 when divided by 4, subjecting two consecutive original packets according to a sequence of serial numbers to encoding to generate an encoded packet with degree 2, expressed as $C_j=D_i \oplus D_{(i+4)}$, wherein i=1, 9, 17, 25, 33 ... ([k/8]−1)*8+1; and sending, by the sender, the encoded packet $C_j$ to the receiver until sequential encoding is completed.

5. The data encoding and decoding method of claim 3, wherein the random encoding comprises:

randomly selecting, by the sender, two original packets from all the original packets for encoding to generate and send an encoded packet with degree 2, and repeating such process, until a feedback packet containing information that "a size of the largest connected component in the decoding graph reaches $k\beta_0$, and an encoded packet with degree 1 is required" is received; according to the feedback packet, adjusting encoding strategy; randomly selecting an original packet from all the original packets to generate and send an encoded packet with degree 1, and repeating such process, until a feedback packet containing information that "the largest connected component is decoded successfully, and the decoding states of all the original packets" is received.

6. The data encoding and decoding method of claim 2, wherein the decoding process comprises:

in the decoding build-up phase, receiving, by the receiver, the encoded packet with degree 2 and updating the decoding graph G; when the largest connected component in the decoding graph reaches $k\beta_0$, sending a feedback packet containing information that "the largest connected component in the decoding graph reaches $k\beta_0$, and an encoded packet with degree 1 is required"; receiving the encoded packet with degree 1 until the largest connected component is successfully decoded, and sending a feedback containing information that "the largest connected component is decoded successfully, and the decoding states of all the original packets";

in the decoding completion phase, receiving the encoded packet with degree m, and updating the decoding graph G; continuously receiving the encoded packet with degree 1 and the encoded packet with degree 2; when the receiver finds that a proportion f(j) of original packets successfully decoded in a j-th decoding and a proportion f(j−1) of original packets successfully decoded in a (j−1)-th decoding satisfies f(j)−f(j−1)>δ (j≥1), sending a feedback packet containing the decoding states of all the original packets to the sender; continuously receiving the encoded packet with degree 1 and the encoded packet with degree 2, and repeating such process, until all the original packets are successfully decoded; and sending a feedback packet containing information that "all the original packets are successfully decoded".

* * * * *